United States Patent
Hong

(10) Patent No.: US 8,294,486 B2
(45) Date of Patent: Oct. 23, 2012

(54) REPAIR CIRCUIT INCLUDING REPAIR CONTROLLER

(75) Inventor: Duck Hwa Hong, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 270 days.

(21) Appl. No.: 12/648,745

(22) Filed: Dec. 29, 2009

(65) Prior Publication Data

US 2011/0029143 A1 Feb. 3, 2011

(30) Foreign Application Priority Data

Jul. 31, 2009 (KR) .................. 10-2009-0070760

(51) Int. Cl.
*H03K 19/003* (2006.01)

(52) U.S. Cl. .. 326/13; 326/49; 365/189.05; 365/189.11; 365/225.7

(58) Field of Classification Search ............... 326/9–13, 326/37–38, 49–50; 365/189.05, 189.08, 365/189.09, 189.11, 200, 201, 225.7
See application file for complete search history.

(56) References Cited

U.S. PATENT DOCUMENTS

| 5,999,038 A | * | 12/1999 | Pathak et al. | 327/525 |
| 7,333,375 B2 | | 2/2008 | Park | |
| 2008/0304341 A1 | * | 12/2008 | Im et al. | 365/200 |
| 2011/0002176 A1 | * | 1/2011 | Chang | 365/189.05 |

FOREIGN PATENT DOCUMENTS

| KR | 10-0632635 B1 | 6/2006 |
| KR | 10-0821572 B1 | 7/2007 |

* cited by examiner

*Primary Examiner* — Shawki Ismail
*Assistant Examiner* — Jany Tran
(74) *Attorney, Agent, or Firm* — Ladas & Parry LLP

(57) ABSTRACT

A repair circuit having a repair controller which is capable of reducing unnecessary current dissipation by interrupting a control operation to redundant cells that are unused for replacement of defective cells is presented. The repair circuit includes a repair controller and a repair signal generator. The repair controller is configured to generate a first drive voltage, a second drive voltage and a repair control signal depending on whether or not a defective cell exists. The repair signal generator driven by the first and second drive voltages in which the repair signal generator is configured to generate a repair signal, for repairing the defective cell, in response to receiving the repair control signal and an external address.

9 Claims, 4 Drawing Sheets

REPAIR CIRCUIT INCLUDING REPAIR CONTROLLER

CROSS-REFERENCE TO RELATED APPLICATIONS

The present application claims priority under 35 U.S.C 119(a) to Korean Application No. 10-2009-0070760, filed on Jul. 31, 2009, in the Korean Intellectual Property Office, which is incorporated by reference in its entirety as set forth in full.

BACKGROUND

An embodiment of the present invention relates to a repair circuit including a repair controller for reducing current dissipation.

Semiconductor memories are additionally equipped with spare memory cells (hereinafter referred to as "redundancy cells" or "redundant cells") for replacing defective memory cells, which are incapable of operating in normal conditions due to defects in memory cell arrays, for the purpose of enhancing product yields thereof. Establishing the number of the redundant cells highly affects yields of semiconductor memories. For instance, a semiconductor memory chip having redundant cells larger than defective cells is disadvantageous to integration density because the redundant cells necessarily cause the chip size to increase. To the contrary, semiconductor memory chips having redundant cells smaller than defective cells are abolished as inferior products, which degrade the product yield. Therefore, evaluating the number of redundant cells in a reasonable degree is important in designing a semiconductor memory.

In a semiconductor memory having a sufficient number of redundant cells, the redundant cells are partly unused for replacing defective cells. Although that, since the redundant cells unused for replacing defective cells are put into a control operation of repair, there would be unnecessary current dissipation. Such current dissipation induces power noise to cause malfunctions in the semiconductor memory.

SUMMARY

There is provided a repair circuit having a repair controller capable of reducing unnecessary current dissipation by interrupting a control operation to redundant cells that are unused for replacing defective cells.

In accordance with an aspect of the present invention, there is provided a repair controller comprising a fuse coupled between a first node and a second node from which a voltage control signal is output; a voltage driver configured to actuate a drive voltage in response to the voltage control signal; and a control signal generator configured to latch a signal of the second node in response to the drive voltage and configured to generate a repair control signal to control a repair operation for a defective cell.

In accordance with an another aspect of the present invention, there is provided a repair circuit comprising a repair controller configured to generate a first drive voltage, a second drive voltage and a repair control signal depending on whether a defective cell occurs; and a repair signal generator driven by the first and second drive voltages and configured to generate a repair signal, which is used in repairing the defective cell, in response to receiving the repair control signal and a row address.

A further understanding of the nature and advantages of the present invention herein may be realized by reference to the remaining portions of the specification and the attached drawings.

BRIEF DESCRIPTION OF THE DRAWINGS

The above and other aspects, features and other advantages will be more clearly understood from the following detailed description taken in conjunction with the accompanying drawings, in which.

DESCRIPTION OF EMBODIMENTS

Hereinafter, various exemplary embodiments will now be described more fully with reference to the accompanying drawings in which some exemplary embodiments are shown. However, specific structural and functional details disclosed herein are merely representative for purposes of describing exemplary embodiments of the present invention. Like numbers refer to like elements throughout the description of the drawings.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" includes any and all combinations of one or more of the associated listed items. Also will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In order to more specifically describe exemplary embodiments, various aspects will be hereinafter described in detail with reference to the attached drawings.

Figure 1:
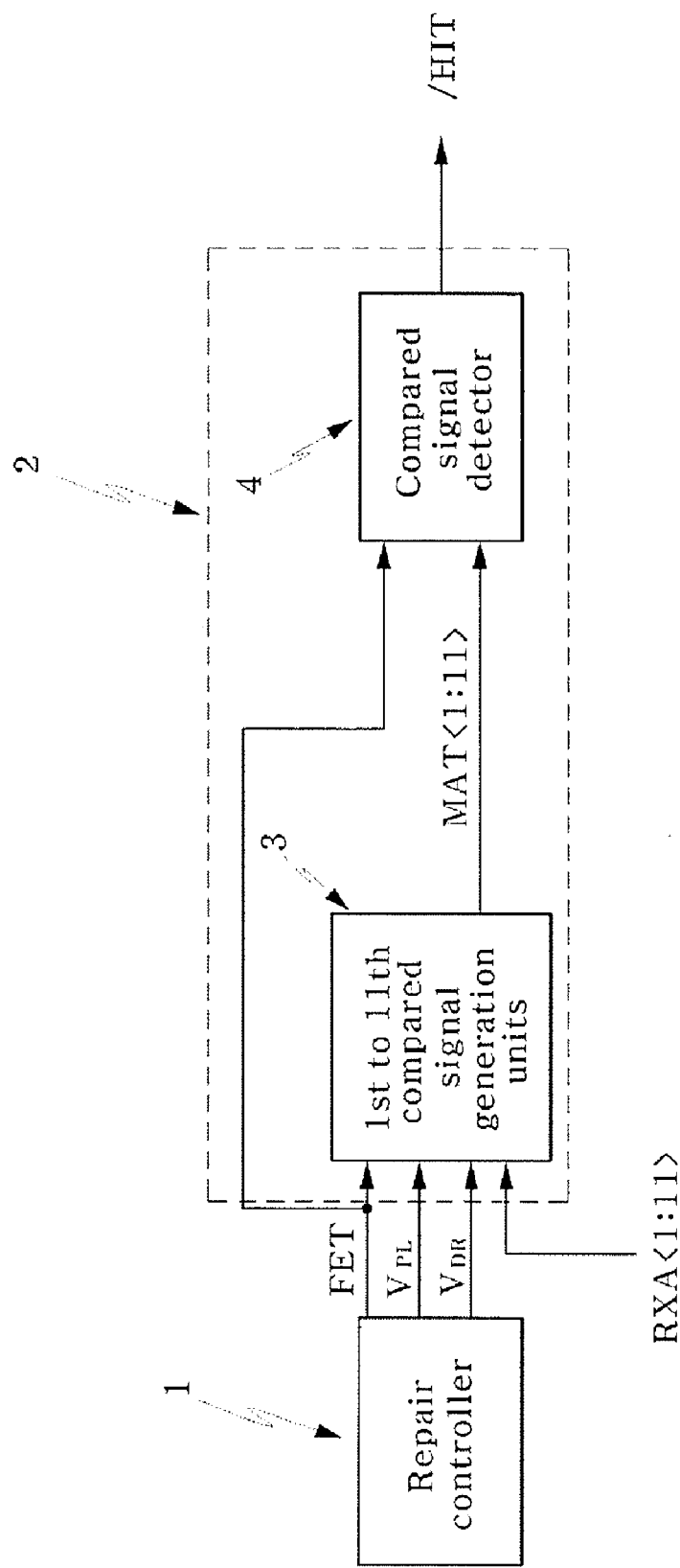
FIG. 1 is a block diagram illustrating a functional configuration of a repair circuit according to an embodiment of the present invention.

FIG. 1 illustrates a functional block configuration of a repair circuit according to an embodiment of the present invention. Referring to FIG. 1, the repair circuit may be comprised of a repair controller 1 and a repair signal generator 2. The repair signal generator 2 may be composed of a compared signal generator 3 and a compared signal detector 4. The compared signal generator 3 is exemplarily formed of first through eleventh compared signal generation units 3<1:11>.

Figure 2:
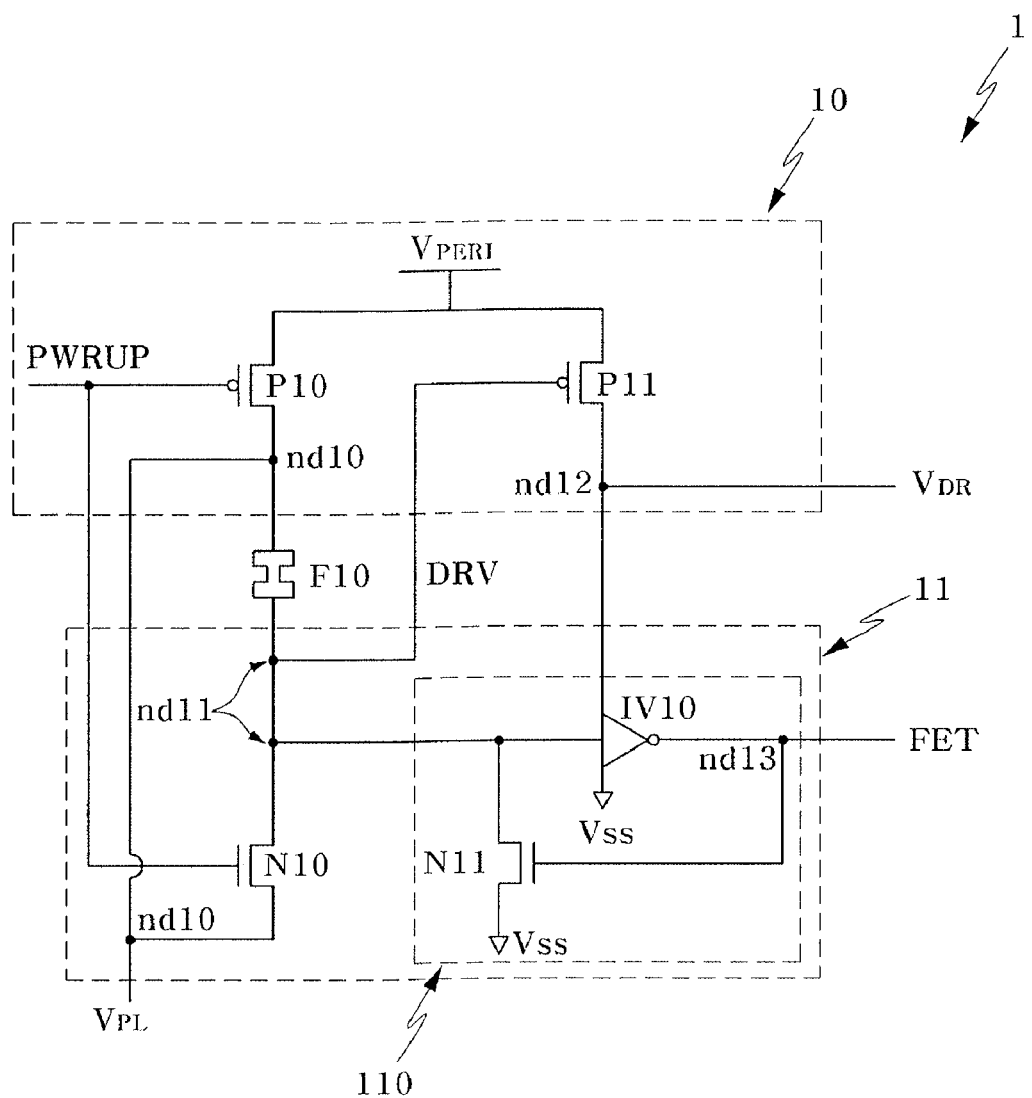
FIG. 2 is a circuit diagram illustrating the repair controller included in the repair circuit shown in FIG. 1.

Referring to FIG. 2, the repair controller 1 may be composed of a voltage driver 10, a fuse F10 and a control signal generator 11.

The voltage driver 10 is exemplarily formed of P-type metal-oxide-semiconductor (PMOS) transistors P10 and P11. The PMOS transistor P10 is coupled between a terminal of an internal voltage $V_{PERI}$ and a node nd10 from which a first drive voltage $V_{PL}$ is output, and functions as pull-up element to pull up a voltage level of the node nd10 in response to a power-up signal PWRUP. The PMOS transistor P11 is coupled between the internal voltage terminal $V_{PERI}$ and a node nd12 from which a second drive voltage $V_{DR}$ is output, and functions as a pull-up element that pulls up a voltage level of the node nd12 in response to a voltage control signal DRV. The power-up signal PWRUP rises up along a level of the power voltage during a period when the power voltage is supplied into a semiconductor memory apparatus and an initial operation begins (hereinafter, referred to as a "power-up period") and goes down to a low level state after the power-up period terminates.

The fuse F10 is coupled between the node nd10 and the node nd11 from which the voltage control signal DRV is output. Cutting off the fuse F10 depends on whether there is a defective cell in a memory cell array that has been completed in fabrication. In this embodiment, the fuse F10 is designed to be cut off when there is a defective cell corresponding thereto.

The control signal generator 11 may be formed of an N-type metal-oxide-semiconductor (NMOS) transistor N10 and a latch circuit 110. The NMOS transistor N10 is coupled between the node nd10 and the node nd11 and functions as a switch element that turns on in response to the power-up signal PWRUP. The latch circuit 110 generates a repair control signal FET by buffering a signal of the node nd11 in supply with the second drive voltage $V_{DR}$ and holds the signal of the node nd11. The latch circuit 110 is exemplarily formed of an inverter IV10 and an NMOS transistor N11. The inverter IV10 functions as a buffer to output the repair control signal FET to a node nd13 by inversely buffering the signal of the node nd11. The NMOS transistor N11 functions as a pull-down element that pulls down a voltage level of the node nd11 in response to a signal of the node nd13. The repair control signal FET is activated to a high level state for controlling a repair operation when there is a defective cell in the memory cell array.

With this configuration, the repair controller 1 supplies the first drive voltage $V_{PL}$, which is driven in a high level state by the internal voltage $V_{PERI}$, when the PMOS transistor P10 is turned on after the power-up period terminates. During this, the repair controller 1 operates to control activations of the second drive voltage $V_{DR}$ and the repair control signal FET depending on whether there is a defective cell, which will be described in detail hereinafter.

First, in case that there is a defective cell, the fuse F10 is cut off (or blown out) to hold the node nd11 on a low level state that is set in the power-up period. Then, the second drive voltage $V_{DR}$ rises up to a high level state through the PMOS transistor P11 that is turned on. The inverter IV10 generates the repair control signal FET in a low level state by supply of the second drive voltage $V_{DR}$.

In the other case, when there is no defective cell, the fuse F10 is not cut off to drive the voltage control signal DRV up to a high level state. The voltage control signal DRV of a high level state stops driving the PMOS transistor P11 and the inverter IV10, so the second drive voltage $V_{DR}$ and the repair control signal FET are generated in low level states.

Figure 3:
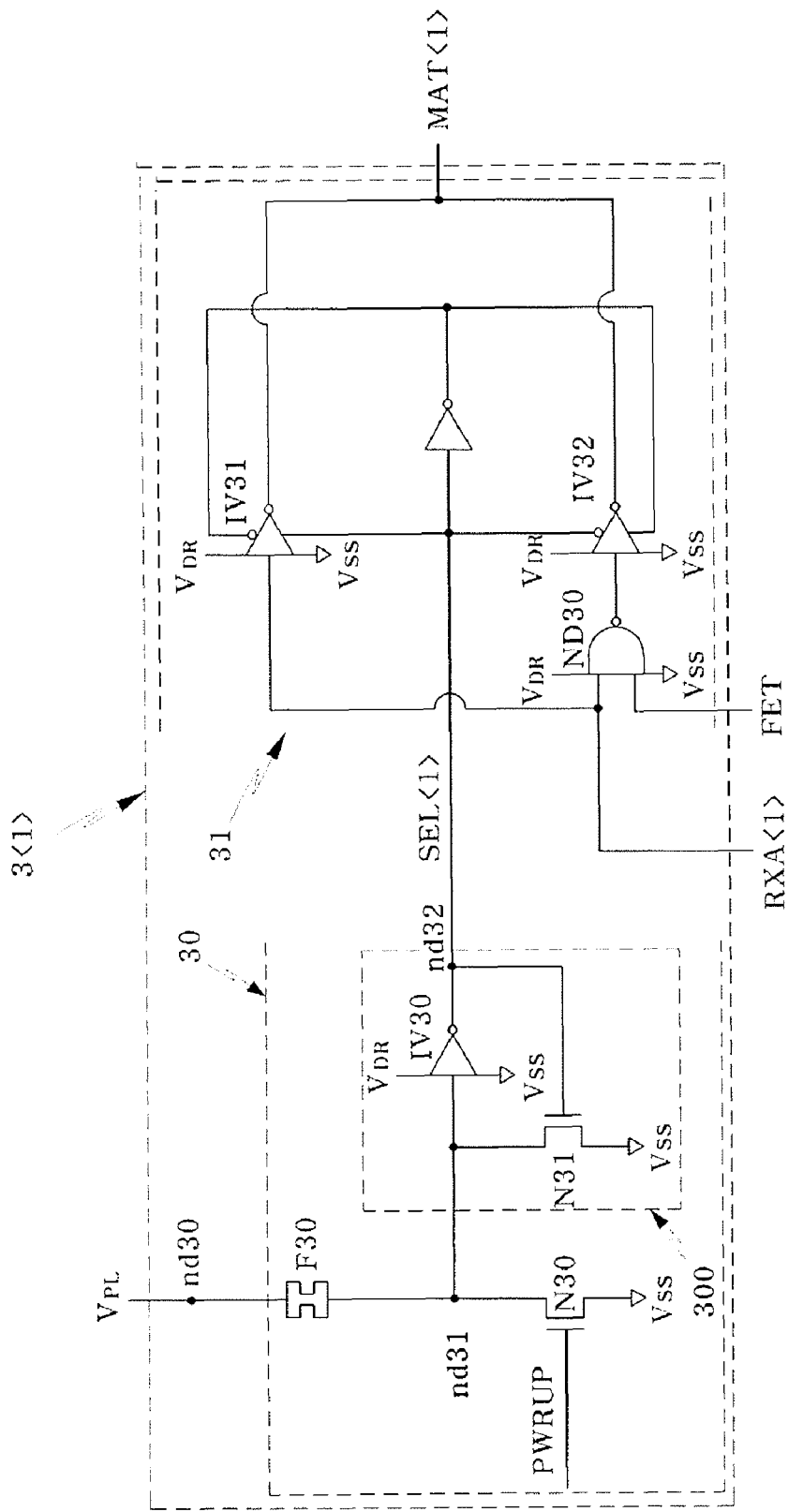
FIG. 3 is a circuit diagram illustrating the first compared signal generator included in the repair circuit shown in FIG. 1.

Now referring to FIG. 3, the first compared signal generation unit 3<1>, representatively, may be composed of a selection signal generator 30 and a selective transmitter 31.

The selection signal generator 30 may be formed of a fuse F30, an NMOS transistor N30 and a buffer circuit 300. The fuse F30 is coupled between a node nd30 into which the first drive voltage $V_{PS}$ is supplied, and a node nd31. The NMOS transistor N30 is coupled between the node nd31 and a terminal of the ground voltage Vss and functions as a pull-down element that pulls down a voltage level of the node nd31 in response to the power-up signal PWRUP. The buffer circuit 300 is driven by the second drive voltage $V_{DR}$ and outputs a first selection signal SEL<1> to a node nd32 by buffering a signal of the node nd31. The buffer circuit 300 is exemplarily formed of an inverter IV30 and an NMOS transistor N31. The inverter IV30 is driven to output the first selection signal SEL<1> by inversely buffering the signal of the node nd31 when the second drive voltage $V_{DR}$ is input thereto in the state of a high level. The NMOS transistor N31 functions as a pull-down element for pulling down a voltage level of the node nd31. The fuse F30 is cut off depending on a first row address signal RXA<1> that corresponds to a defective cell. In this embodiment, the connection through the fuse F30 is sustained when the first row address signal RXA<1> corresponding to the defective cell is set on a high level state. The fuse F30 is cut off when the first row address signal RXA<1> corresponding to the defective cell is set on a low level state. Thus, the selection signal generator 30 output the first selection signal SEL<1> in a low level state when the first row address signal RXA<1> corresponding to the defective cell is set on a high level state. But, when the first row address signal RXA<1> corresponding to the defective cell is set on a low level state, then the selection signal generator 30 outputs the first selection signal SEL<1> in a high level state.

The selective transmitter 31 is exemplarily formed of a gate ND30, an inverter IV31 and an inverter IV32. The gate ND30 receives the first row address signal RXA<1> and the repair control signal FET. The gate ND30 is driven by the second drive voltage $V_{DR}$ that is on a high level state. The gate ND30 functions as a buffer to process the first row address signal RXA<1> in response to the repair control signal FET. The inverter IV31 is driven by the second drive voltage $V_{DR}$ of a high level state such that the inverter IV31 functions as a transmission element for inversely buffering the first row address signal RXA<1> in response to the first selection signal SEL<1>. The inverter IV31 transfers the inverted first row address signal RXA<1> as a first compared signal MAT<1>. The inverter IV32 is driven by the second drive voltage $V_{DR}$ of a high level state and functions as a transmission element for inversely buffering an output signal of the gate ND30 in response to the first selection signal SEL<1>. The inverter IV32 transfers the inverted output signal of the gate ND30 as the first compared signal MAT<1>. With this configuration, the selective transmitter 31 generates the compared signal MAT<1> in a high level state when the first row address signal RXA<1> is conditioned in a level state corresponding to a defective cell. Otherwise, the compared signal MAT<1> is generated in a low level state from the selective transmitter 31 when the first row address signal RXA<1> is out of a logical level corresponding to a defective cell.

The second through eleventh compared signal generation units 3<2:11> included in the compared signal generator 3 are substantially similar to the first compared signal generation unit 3<1>, except that the second through eleventh row address signals RXA<2:11> are input respectively thereto instead of inputting the first row address signal RXA<1> and except that the second through eleventh compared signals MAT<2:11> are input respectively thereto instead of inputting the first compared signal MAT<1>. Thus, the second through eleventh compared signal generation units 3<2:11> will not be further detailed later.

With this configuration, when there is an input of the first through eleventh row address signals RXA<1:11> that corresponds to a defective cell, then the compared signal generator 3 generates the first through eleventh compared signals MAT<1:11> that are all activated on high level states. In further detail, the first through eleventh compared signal generation units 3<1:11> include fuses, respectively, which are cut off depending on a result of testing defective cells. For instance, when a row address of a defective cell is '10001000111', the fuses belonging to the first through third compared signal generation units 3<1:3>, the seventh compared signal generation unit 3<7> and the eleventh compared signal generation unit 3<11> are kept connected while the fuses corresponding to the fourth through sixth compared signal generation units 3<4:6> and the eighth through tenth compared signal generation units 3<8:10> are cut off. Therefore, the first through third compared signal generation units 3<1:3>, the seventh compared signal generation unit 3<7> and the eleventh compared signal generation unit 3<11> generate the first through third compared signals MAT<1:3>, the seventh compared signal MAT<7> and the eleventh compared signal MAT<11> in the same levels with the row address signals RXA<1:3>, RXA<7> and RXA<11>, respectively. In contrast, the fourth through sixth compared signal generation units 3<4:6> and the eighth through tenth compared signal generation units 3<8:10> respectively generate the fourth through sixth compared signals MAT<4:6> and the eighth through tens compared signals MAT<8:10> in inverted levels of the row address signals RXA<4:6> and RXA<8:10> input thereto.

Figure 4:
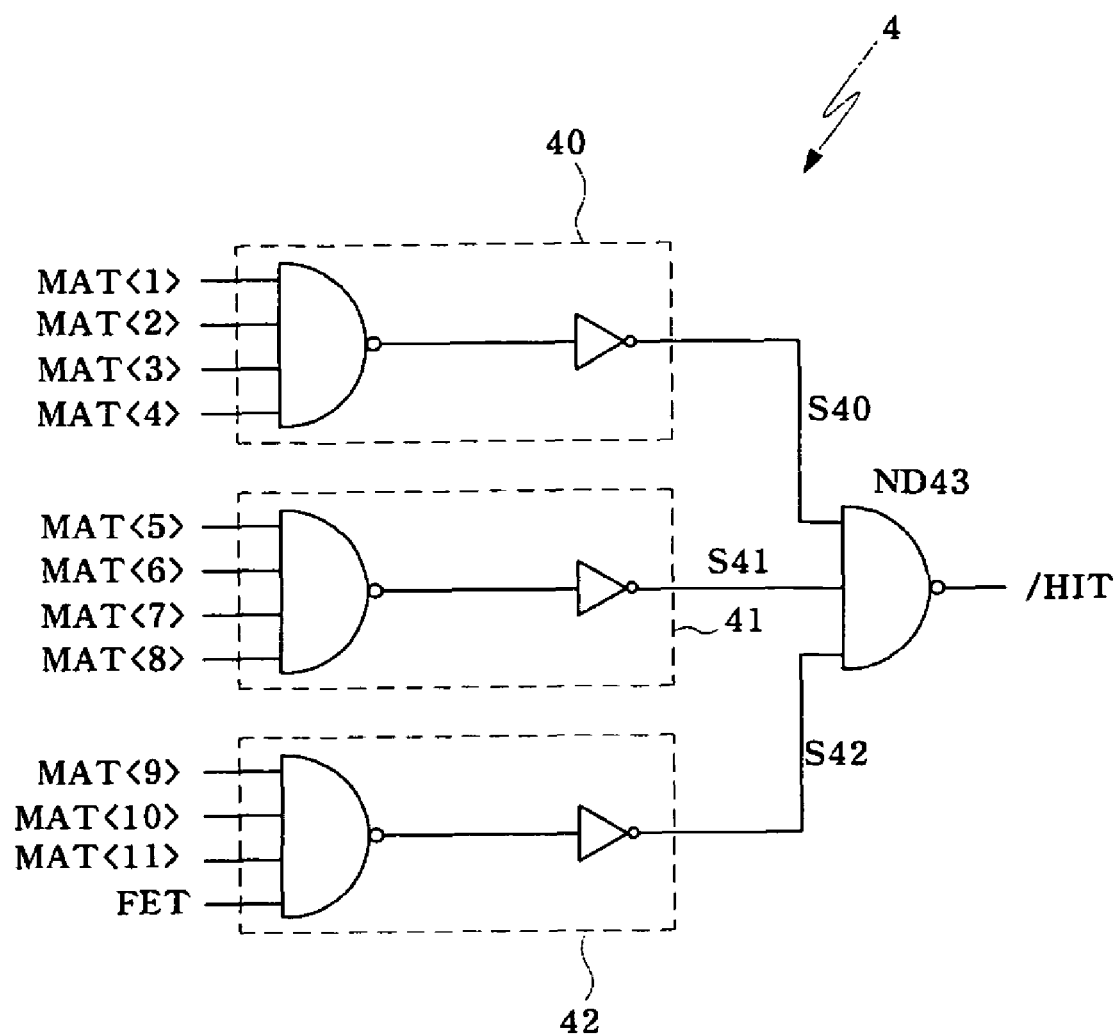
FIG. 4 is a circuit diagram illustrating the compared signal detector included in the repair circuit shown in FIG. 1.

Referring to FIG. 4, the compared signal detector 4 may be composed of a logical element 40, a logical element 41, a logical element 42 and a gate ND43. The logical element 40 outputs a signal S40 by conducting an AND operation with the first through fourth compared signals MAT<1:4>. The logical element 41 outputs a signal S41 by conducting an AND operation with the fifth through eighth compared signals MAT<5:8>. The logical element 42 outputs a signal S42 by conducting an AND operation with the ninth through eleventh compared signals MAT<9:11>. The gate ND43 outputs a repair signal /HIT from the signals S40, S41 and S42. With this configuration, the compared signal detector 4 generates the repair signal /HIT by detecting voltage levels of the first through eleventh compared signals MAT<1:11> in response to the repair control signal FET. The repair signal /HIT is activated in a low level state for replacing a defective cell with a redundant cell. The repair signal /HIT is generated in a high level state from the compared signal detector 4 when the repair control signal FET is set on a low level state. To the contrary, the repair signal /HIT is generated in a low level state from the compared signal detector 4 when the repair control signal FET and the first and eleventh compared signals MAT<1:11> are all set on high level states.

Now hereinafter will be described an operation of the repair circuit in conjunction with FIGS. 1 through 4.

First, corresponding to the case that there is a defective cell in the memory cell array, the fuse F10 included in the repair controller 1 is preliminarily set in the cutoff state and the fuses belonging respectively to the first through eleventh compared signal generation units 3<1:11> are also preliminarily set to be each controllable (to be cut off or not) by the row address signals RXA<1:11>. In the repair circuit, during the power-up period, a signal of the node nd11 is initialized at a low level state by the NMOS transistor N10 that is turned on in response to the power-up signal PWRUP of a high level state. After the power-up period, the PMOS transistor P10 turned on in response to the power-up signal PWRUP of the high level state operate to supply the first drive voltage $V_{PL}$, which is activated in a high level state, into the node nd10. As the fuse F10 has been already set in the cutoff state, the signal of the node nd11 is substantially maintained on the low level state that has been initialized during the power-up period. Thus, the PMOS transistor P11 is turned on in response to the voltage control signal DRV of a low level state which is output from the node nd11 and then the second drive voltage $V_{DR}$ is supplied into the node nd12 in a high level state. Accordingly, the latch circuit 110 of the control signal generator 11 is driven by a supply of the second drive voltage $V_{DR}$ at a high level state and the latch circuit 110 generates the repair control signal FET that is activated in a high level state. Also the compared signal generator 3 is driven by a supply with the second drive voltage $V_{DR}$ and generates the first through eleventh compared signals MAT<1:11> that are all activated in high level states when there is an input of the first through eleventh row address signals RXA<1:11> corresponding to a defective cell. During this, the compared signal detector 4 generates the repair signal /HIT in response to receiving the repair control signal FET at a high level state and the first through eleventh compared signals MAT<1:11> at high level states, and then the defective cell is replaced with a redundant cell in response to the repair signal /HIT at the low level state.

On the other hand, corresponding to the situation where there is no defective cell in the memory cell array, the fuse F10 of the repair controller 1 is preliminarily set to be in connection. Under this condition of the repair circuit, a signal of the node nd11 is initialized at a low level state by the NMOS transistor N10 in response to the power-up signal PWRUP that is set at a high level state. After the power-up period, the repair controller 1 supplies the first drive voltage $V_{PL}$ at a high level state into the node nd10 through the PMOS transistor P10, which is turned on, in response to the power-up signal PWRUP at a low level state. During this, as the fuse F11 is set to be in connection, the node nd11 is driven up to a high level state. Thus, the voltage control signal DRV of a high level state output from the node nd11 turns the PMOS transistor P11 on to interrupt power to the second drive voltage $V_{DR}$, so that the second drive voltage $V_{DR}$ drops to a low level state. As the second drive voltage $V_{DR}$ goes down to the low level state, driving the buffer circuit 110 of the control signal generator 11 is stopped and then the repair control signal FET is generated at a low level state. Further, the compared signal generator 3 is not further driven to disable the generation of the first through eleventh compared signals MAT<1:11>. During this, as the compared signal detector 4 generates the repair signal /HIT at a high level state in response to the repair control signal FET at a low level state, the repair operation for replacing a defective cell is disabled.

As aforementioned, the repair circuit according to this exemplary embodiment is able to interrupt the second drive voltage $V_{DR}$ at a high level state to the control signal generator 11 and the compared signal generator 3, by using the voltage control signal DRV at a high level state that is output from the node nd12 coupled with the fuse F10, by setting the fuse F10 in connection when there is no defective cell in the memory cell array. Thus, the control signal generator 11 and the compared signal generator 3 actuated by the second drive voltage $V_{DR}$ of the high level state are stopped to be driven when a defective cell does not occur. As a result, the repair circuit according to exemplary embodiments is effective in reducing unnecessary current dissipation because a control operation to redundant cell, which is unused for replacing a defective cell, is disabled by interrupting the supply of the drive voltage for driving the control operation of the redundant cell.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this invention as defined in the claims.

What is claimed is:

1. A repair circuit comprising:
    a fuse coupled between a first node from which a first drive voltage is output, and a second node from which a voltage control signal is output;
    a voltage driver configured to drive a second drive voltage in response to the voltage control signal;
    a control signal generator configured to latch a signal of the second node in response to the second drive voltage and configured to generate a repair control signal controlling a repair operation for the defective cell; and
    a repair signal generator driven by the first and second drive voltages and configured to generate a repair signal, which is used in repairing the defective cell, in response to receiving the repair control signal and a row address.

2. The repair circuit according to claim 1, wherein the voltage driver comprises:
    a first pull-up element coupled between an internal power terminal and the first node and configured to pull up a voltage level of the first node in response to a power-up signal; and
    a second pull-up element coupled between the internal voltage terminal and a third node from which the second drive voltage is output and configured to pull up a voltage level of the third node in response to the voltage control signal.

3. The repair circuit according to claim 1, wherein the control signal generator comprises a buffer circuit driven by the second drive voltage and configured to generate the repair control signal by buffering a signal of the second node.

4. The repair circuit according to claim 3, wherein the buffer circuit comprises:
    a buffer configured to be driven by the second drive voltage and configured to output the repair control signal into a fourth node by buffering the signal of the second node; and
    a pull-down element configured to pull down a voltage level of the second node in response to a signal of the fourth node.

5. The repair circuit according to claim 3, wherein the control signal generator further comprises: a switch element coupled between the first and second nodes and turned on in response to a power-up signal.

6. The repair circuit according to claim 1, wherein the repair signal generator comprises:
    a compared signal generator driven by the first and second drive voltages and configured to generate a compared signal from the row address in response to the repair control signal; and
    a compared signal detector configured to generate the repair signal by detecting a voltage level of the compared signal in response to the repair control signal.

7. The repair circuit according to claim 6, wherein the compared signal generator comprises:
    a selection signal generator driven by the first and second drive voltages and configured to generate a selection signal; and
    a selective transmitter configured to transfer the row address as the compared signal after buffering or inversely buffering the row address by the selection signal.

8. The repair circuit according to claim 7, wherein the selection signal generator comprises:
    a fuse coupled between a first node into which the first drive voltage is supplied, and a second node;
    a pull-down element coupled between the second node and a ground voltage terminal and configured to pull down a voltage level of the second node in response to a power-up signal; and
    a buffer circuit driven by the second drive voltage and configured to generate the selection signal by buffering a signal of the second node.

9. The repair circuit according to claim 7, wherein the selective transmitter comprises:
    a buffer driven by the second drive voltage and configured to buffer the row address in response to the repair control signal;
    a first transmission element driven by the second drive voltage and configured to transfer the row address as the compared signal after buffering the row address; and
    the second transmission element driven by the second drive voltage and configured to transfer an output signal of the buffer as the compared signal after buffering the output signal of the buffer in response to the selection signal.

* * * * *